Oct. 3, 1961 H. R. BEURRIER 3,003,143

SELECTING CIRCUIT

Filed May 28, 1959

INVENTOR
H. R. BEURRIER
BY
R. C. Winter
ATTORNEY

United States Patent Office
3,003,143
Patented Oct. 3, 1961

3,003,143

SELECTING CIRCUIT

Henry R. Beurrier, Parsippany, N.J., assignor to Bell Telephone Laboratories, Incorporated, New York, N.Y., a corporation of New York Filed May 28, 1959, Ser. No. 816,505
8 Claims. (Cl. 340—347)

This invention relates to circuits for selecting a particular one of a number of signaling leads in response to a binary code designation and more particularly to such circuits employing a capacitive matrix.

Various arrangements are known in the art for applying a given signal to a particular one of a number of output signaling leads in response to a particular combination of input pulses. These arrangements are known as translating circuits, as well as selecting circuits, since they can be considered to translate from a binary code designation at plural input terminals to a particular one of a plurality of output terminals, which may represent elements of a non-binary code.

Such translator circuits may include a plurality of distinct coupling devices with individual electrical connections to the input and output circuitry. Many of the known translator coupling devices include active elements, so that failures traceable to such devices are not uncommon. In addition such devices are comparatively sensitive to variations in control voltages, thus imposing margins on the operation of the translator circuit.

It is, therefore, a general object of this invention to provide an improved translator selecting circuit.

A further object of this invention is to provide a selecting circuit which is economical to fabricate, reliable in operation and relatively insensitive to variations of operating voltages.

In accordance with these and other objects of this invention there is provided in one specific embodiment thereof a pair of printed circuit boards each having parallel conductors deposited thereon. These boards are arranged so that the conductors on one of the boards are at right angles to the conductors on the other board. A configuration of capacitive couplings is positioned between selected pairs of the orthogonal printed conductors of the respective boards in accordance with a patent application of E. R. Kretzmer, Serial No. 816,451, filed May 28, 1959. From the matrix thus formed, individual connections advantageously are provided from the conductors on one board to a plurality of bistable control devices and from the conductors on the other board to a plurality of output gating circuits.

The plurality of capacitive couplings between the conductors of the two boards is so arranged that for any given condition of the bistable control devices a pulse is coupled through the matrix to all but one output gating circuit. The particular output gating circuit at which no pulse from the matrix appears constitutes the one selected by the particular condition established by the input bistable control devices. Advantageously, the output gating circuits are connected such that pulses from the matrix serve to inhibit the passage of pulses from a clock source to the individual output circuits. Thus the selected gating circuit, having no inhibit pulse applied thereto, permits the clock pulse, which is received simultaneously at all of the gating circuits, to be transmitted over its corresponding output lead. In this fashion, the circuit of the invention achieves the selection of a particular output lead by controlling the application thereto of a clock pulse while requiring a minimum amount of power from the controlling circuitry.

In accordance with this specific embodiment of the invention capacitive couplings at positions other than those intended in the selection process are eliminated by the provision of a grounded conducting sheet inserted between insulating layers separating the orthogonal printed conductors. Only through holes in the grounded sheet is any capacitive coupling provided between opposed pairs of row and column conductors. These holes are positioned in a preselected pattern on the grounded sheet so as to provide capacitive couplings at locations permitting a desired correspondence of input binary codes and output conductors. In addition to providing a simple and reliable selecting circuit, this invention achieves flexibility of operation by permitting the alteration of the stored selection code by the ready substitution of other grounded sheets carrying different hole patterns.

It is a feature of this invention that the combination of a plurality of selectively positioned capacitive couplings in a matrix array, with access and readout circuitry, provide the desired selection of a particular output conductor corresponding to particular conditions of a plurality of input conductors.

It is a further feature of this invention that dual outputs of a bistable control device be employed in applying pulses to selectively positioned capacitive couplings of a matrix so that only one of a plurality of output leads is selected.

An additional feature of this invention is the provision of capacitive couplings between selected pairs of row and column conductors to apply an output pulse to all but one of a plurality of output conductors in response to a particular combination of input pulses.

Another feature of this invention is the provision of a grounded conducting sheet between opposite row and column conductors of a matrix with selectively positioned holes in the sheet to establish capacitive couplings only between predetermined pairs of matrix conductors.

Still another feature of this invention is the provision of a matrix of row and column conductors with selectively positioned capacitive couplings therein established by a grounded conducting sheet carrying a particular pattern of apertures situated between the row and column conductors and removable so that another such sheet with a different aperture pattern may be substituted.

A complete understanding of this invention and of these and various other features may be gained from the following detailed description and the accompanying drawing in which.

Figure 3:
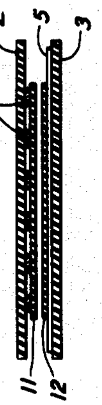
FIG. 3 depicts a cross sectional view of the matrix of FIG. 1.
Figure 1:
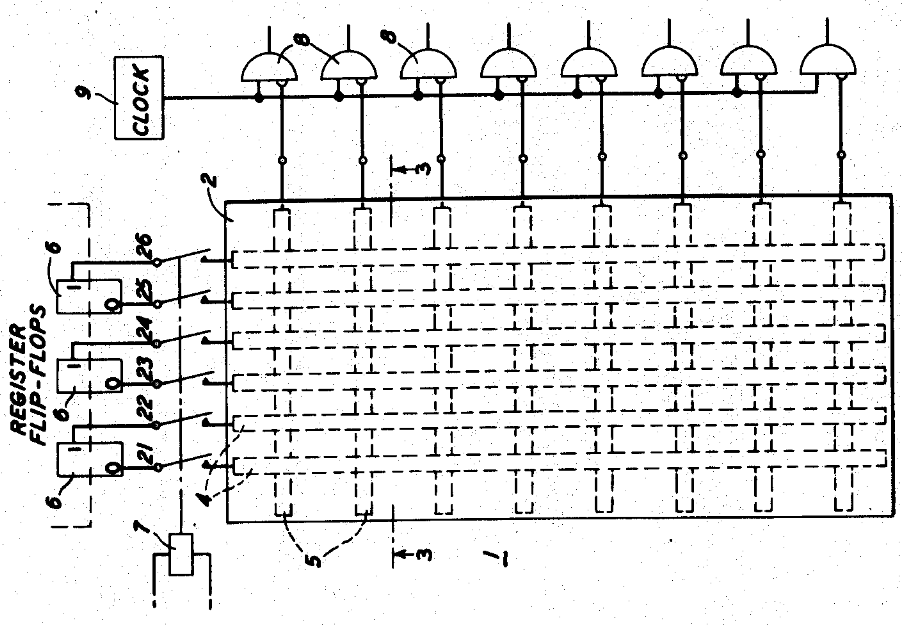
FIG. 1 is a representation, primarily in block diagram form, of a translator circuit including a matrix of conductors in accordance with one specific embodiment of the invention.

FIGS. 1 and 3 present different views of a conductive matrix in accordance with this invention. FIG. 3 is a sectional view taken along the line 3—3. Together these figures show a matrix 1 comprising an upper board 2 having column conductors such as 4 coated with an insulating film 11 and a lower board 3 having row conductors such as 5 coated with an insulating film 12. The upper and lower portions of the matrix 1 are space apart slightly to permit the insertion of the sheet 10 of FIG. 2 which will be described later.

Associated with the matrix 1 is a plurality of bistable control devices 6 respectively connected to the column conductors 4 through individual contacts of a relay 7. The bistable devices 6 in this embodiment of the invention advantageously are flip-flops, or bistable multivibrators, each of which produces in opposite phase relationship an active condition on one or the other of its two output leads, depending on the state of the flip-flop.

Associated with each row conductor is a gate 8. Gates 8 are of the inhibiting type, such as are known in the art, arranged so that a pulse on any one of the row electrodes 5 blocks the passage of any pulse on the other input lead of the associated gate 8. The controlled input leads of these gates are connected in parallel to a source 9 of timing pulses, often referred to as clock pulses.

Figure 2:
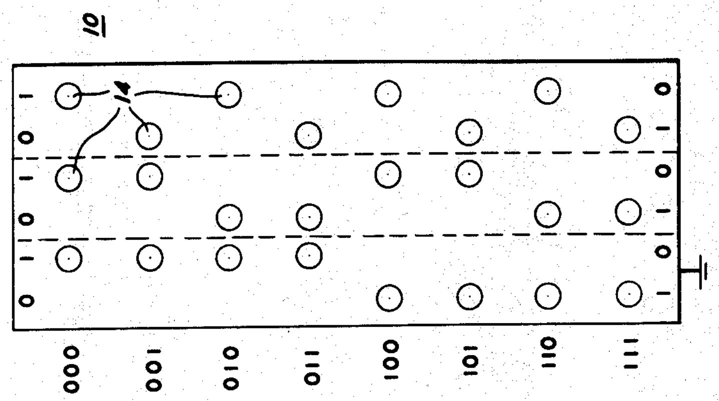
FIG. 2 depicts a conducting sheet for providing predetermined capacitive couplings in the matrix of FIG. 1 in accordance with one particular code arrangement.

FIG. 2 depicts a particular sheet 10 for insertion in the matrix 1 of FIG. 1 between the boards 2 and 3 to complete the arrangement of the invention depicted in FIG. 1. The sheet 10 is composed of a conducting material with a number of holes 14 through the sheet. The sheet 10 is grounded, thus permitting the transmission of signals between the matrix conductors 4 and 5 on opposite sides of the sheet only through the capacitive couplings provided by the air dielectric of the holes 14. The holes 14 are selectively positioned in the sheet 10 of FIG. 2 to represent various binary coded numbers in accordance with the desired operation of the arrangement depicted in FIG. 1.

An alternative arrangement within the scope of this invention is to fabricate the sheet 10 with the insulating films 11 and 12 bonded thereto instead of to the conductors 4 and 5 of FIG. 2. The holes 14 may then be punched through the films 11 and 12 as well as through the sheet 10 if desired.

In operation, an active condition will exist on three of the output leads from the devices 6. Which three of these leads are active will depend, of course, on the particular row electrode 5 which is to be selected. When the desired states of the respective flip-flops 6 are established, relay 7 is operated simultaneously with the application of a clock pulse from pulse source 9. The matrix arrangement will then determine which one of the output gates 8 will remain enabled so as to pass the clock pulse to its corresponding output lead.

For purposes of illustration, consider that the output lead corresponding to the binary number 101 is to be selected. Flip-flops 6 are set accordingly, thus producing an active output on leads 22, 23 and 26. A comparison of the positions of the holes 14 in the coded dielectric sheet 10, FIG. 2, with the conditions of the leads 21 through 26, will demonstrate that only that row electrode 5 opposite the portion of the sheet 10 designated 101 does not have a capacitive coupling with at least one of the active leads 22, 23 and 26 through one or more of the holes 14. Wherever there is capacitive coupling between a row electrode 5 and any column electrode 4 which is connected through the contacts of the relay 7 to one of the active leads 22, 23 and 26, the pulse transmitted by the closure of these contacts produces a signal on the associated row electrode 5. Since the electrode 5 at the level designated 101 is the only one having no coupling with the column electrodes 4 connected to active leads 22, 23 and 26, this particular row electrode 5 is the only one which will have no pulse coupled thereto from the active leads 22, 23 or 26. As a result the gate 8 connected to the row electrode 5 at the selected level is not inhibited and the clock pulse from the pulse source 9, which is applied simultaneously to all of the gates 8, passes through only that one associated with the level 101 to produce a signal at its output indicating selection of this particular lead.

The operation of the invention has been described with reference to an input binary code signal comprising two direct current potentials for the two binary digits. It is within the scope of this invention to employ alternating current signals for the binary code. That is, for each input electrode to be energized, corresponding to one binary digit, an alternating signal, such as from an oscillator, is applied. To the remaining input leads, corresponding to the other binary digit, no signal is applied. Selection of the desired output lead is then effected by the lack of a signal on the designated lead, since the capacitive couplings of the selection matrix readily conduct alternating current signals, just as they conduct direct current pulses, in the manner already described.

It is to be understood that the above-described arrangements are illustrative of the principles of the invention. Numerous other arrangements may be devised by those skilled in the art without departing from the spirit and scope of the invention.

What is claimed is:

1. An electrical circuit comprising a plurality of dual-output bistable devices for providing a selected binary code designation, a matrix of row and column conductors, means providing capacitive couplings between selected pairs of said row conductors and said column conductors, means for connecting the dual outputs of each of said bistable devices with a corresponding pair of said column conductors of said matrix, and means connected to each of said row conductors for detecting the absence of capacitive coupling between one of said row conductors and all of the active outputs of said bistable devices.

2. A selecting circuit for designating one out of a plurality of output leads corresponding to an input signal in binary code comprising a capacitive matrix having row and column electrodes, individual capacitive coupling means between selected row and column electrodes, a plurality of bistable devices, means for connecting complementary outputs of said bistable devices to said matrix column electrodes, and signal detecting means comprising an output means connected between each of said row electrodes and a corresponding one of said output leads, means for applying pulses to all of said output means, and means including said capacitive coupling means for inhibiting said pulses through all except one of said output means.

3. A selecting circuit in accordance with claim 2 wherein said capacitive coupling means further comprises an interchangeable grounded conducting sheet insulated from said row and column electrodes.

4. A selecting circuit in accordance with claim 3 wherein said individual capacitive couplings are provided by means of selectively positioned holes in said grounded sheet.

5. A translator circuit comprising a matrix of row and column conductors, a source of binary coded signals, means for connecting said signal source concurrently to each of said column conductors, means for providing capacitive couplings between selected crossings of said row and column conductors in accordance with the binary code designations of said row conductors, means for detecting the presence of signals on said row conductors, and means for providing an output signal in the absence of a signal on a selected one of said row conductors.

6. A translator circuit in accordance with claim 5 wherein said means for providing capacitive couplings comprises a grounded conducting sheet insulated from said row and column conductors with apertures selectively positioned therein.

7. A translator circuit for selecting a particular one of a plurality of output leads in accordance with a multiple digit binary address comprising a matrix of row and column conductors, means for applying input signals representing a plurality of binary digits and their complements simultaneously to corresponding column electrodes in said matrix, output means connected between each of said row conductors and corresponding output leads, and means for inhibiting selected ones of said output means comprising capacitive means connected between selected row and column conductors of said matrix for coupling said applied binary digit signals on certain of said column electrodes to the corresponding row electrodes.

8. A translator circuit in accordance with claim 7 wherein said capacitive means comprises a selected one of a plurality of interchangeable grounded conducting sheets, said sheets having apertures at selected positions aligned in rows and columns in conformance with said matrix row and column conductors, a first layer of insulating material positioned between said conducting sheet and said matrix row conductors, and a second layer of inculating material positioned between said conducting sheet and said matrix column conductors.

References Cited in the file of this patent

UNITED STATES PATENTS

| | | |
|---|---|---|
| 2,686,299 | Eckert | Aug. 10, 1954 |
| 2,823,368 | Avery | Feb. 11, 1958 |
| 2,870,431 | Babcock | Jan. 20, 1959 |
| 2,872,664 | Minot | Feb. 3, 1959 |